United States Patent
Kuo et al.

(10) Patent No.: US 10,656,044 B1
(45) Date of Patent: May 19, 2020

(54) EASY-TO-MOUNT LEAKAGE DETECTION SLEEVE

(71) Applicant: COOLER MASTER CO., LTD., New Taipei (TW)

(72) Inventors: Chu-Yi Kuo, New Taipei (TW);
Tsung-Wei Lin, New Taipei (TW);
Chun-Hsien Chen, New Taipei (TW)

(73) Assignee: COOLER MASTER CO., LTD., New Taipei (TW)

( * ) Notice: Subject to any disclaimer, the term of this patent is extended or adjusted under 35 U.S.C. 154(b) by 0 days.

(21) Appl. No.: 16/426,841

(22) Filed: May 30, 2019

(30) Foreign Application Priority Data

Feb. 22, 2019 (TW) .............................. 108202265 U

(51) Int. Cl.
| | |
|---|---|
| *G01M 3/16* | (2006.01) |
| *G01M 3/18* | (2006.01) |
| *H05K 7/20* | (2006.01) |
| *G06F 1/20* | (2006.01) |

(52) U.S. Cl.
CPC ............ *G01M 3/165* (2013.01); *G01M 3/182* (2013.01); *G06F 1/20* (2013.01); *G06F 2200/201* (2013.01); *H05K 7/20272* (2013.01)

(58) Field of Classification Search
CPC ........ G01M 3/165; G01M 3/18; G01M 3/182; G06F 1/20; G06F 2200/201; H05K 7/20272; H01B 7/17; H01B 7/18; H01B 7/185; H01B 7/28; H01B 7/282
See application file for complete search history.

(56) References Cited

U.S. PATENT DOCUMENTS

| | | | | |
|---|---|---|---|---|
| 3,467,761 A | * | 9/1969 | Plummer ............... | H01B 9/024 174/36 |
| 6,111,194 A | * | 8/2000 | Kroulik .................. | F16L 57/06 138/128 |
| 2005/0062487 A1 | * | 3/2005 | Strackbein ............. | G01M 3/18 324/696 |

* cited by examiner

*Primary Examiner* — Timothy J Thompson
*Assistant Examiner* — Amol H Patel
(74) *Attorney, Agent, or Firm* — Maschoff Brennan

(57) ABSTRACT

The disclosure provides an easy-to-mount leakage detection sleeve configured to be mounted on a tube. The easy-to-mount leakage detection sleeve includes a flexible water absorbing layer, a plurality of electrically conductive wires and a connecting assembly. The plurality of electrically conductive wires are disposed on the flexible water absorbing layer and spaced apart from each other. The connecting assembly includes a first connecting part and a second connecting part. The first connecting part and the second connecting part are respectively disposed on two opposite sides of the flexible water absorbing layer, and the second connecting part is detachably engaged with the first connecting part so that the flexible water absorbing layer forms a tube accommodation space configured for accommodating the tube.

12 Claims, 6 Drawing Sheets

EASY-TO-MOUNT LEAKAGE DETECTION SLEEVE

CROSS-REFERENCE TO RELATED APPLICATIONS

This non-provisional application claims priority under 35 U.S.C. § 119(a) on Patent Application No(s). 108202265 filed in Taiwan, R.O.C. on Feb. 22, 2019, the entire contents of which are hereby incorporated by reference.

TECHNICAL FIELD

The disclosure relates to a leakage detection sleeve, more particularly to an easy-to-mount leakage detection sleeve.

BACKGROUND

As the technology progresses, higher power electronic devices, such as central processing unit or graphic processing unit, would generate more heat than could be effectively dissipated by the conventional heat dissipation device.

Thus, liquid cooling system is applied to solve such problem. In the liquid cooling system, heat can be effectively absorbed and dissipated by the liquid coolant which is pumped in tubing. During shipping, the tubing might get damaged, and it's even often to find cracks in the tubing and cause leakage of the liquid coolant. Thus, a leakage detection device is applied. The conventional leakage detection device is not able to be disposed on the tubing, instead, it is disposed on the internal surface of the device casing and waiting for the drop of the leakage. However, it is difficult for the leakage detection device in such a location to timely detect the leakage because it takes time and needs a certain amount of the leakage to create a drop, and the drop might even not perfectly fall on the leakage detection device.

SUMMARY

The disclosure provides an easy-to-mount leakage detection sleeve that is easy to be mounted on a tube and thus achieving a timely detection on leakage.

One embodiment of the disclosure provides an easy-to-mount leakage detection sleeve configured to be mounted on a tube. The easy-to-mount leakage detection sleeve includes a flexible water absorbing layer, a plurality of electrically conductive wires and a connecting assembly. The plurality of electrically conductive wires are disposed on the flexible water absorbing layer and spaced apart from each other. The connecting assembly includes a first connecting part and a second connecting part. The first connecting part and the second connecting part are respectively disposed on two opposite sides of the flexible water absorbing layer, and the second connecting part is detachably engaged with the first connecting part so that the flexible water absorbing layer forms a tube accommodation space configured for accommodating the tube.

According to the leakage detection sleeve discussed above, due to the first connecting part and the second connecting part, the flexible water absorbing layer with the electrically conductive wires can form the tube accommodation space and be easily mounted on or removed from the tube. Therefore, the leakage detection sleeve can be directly mounted on the tube and timely detect the leakage in the tube.

The above summary of the disclosure and the following detailed descriptions are used to illustrate the principle of the disclosure and provide a further explanation of the claims of the disclosure.

BRIEF DESCRIPTION OF THE DRAWINGS

The present disclosure will become better understood from the detailed description given herein below and the accompanying drawings which are given by way of illustration only and thus are not intending to limit the present disclosure and wherein.

DETAILED DESCRIPTION

Figure 1:
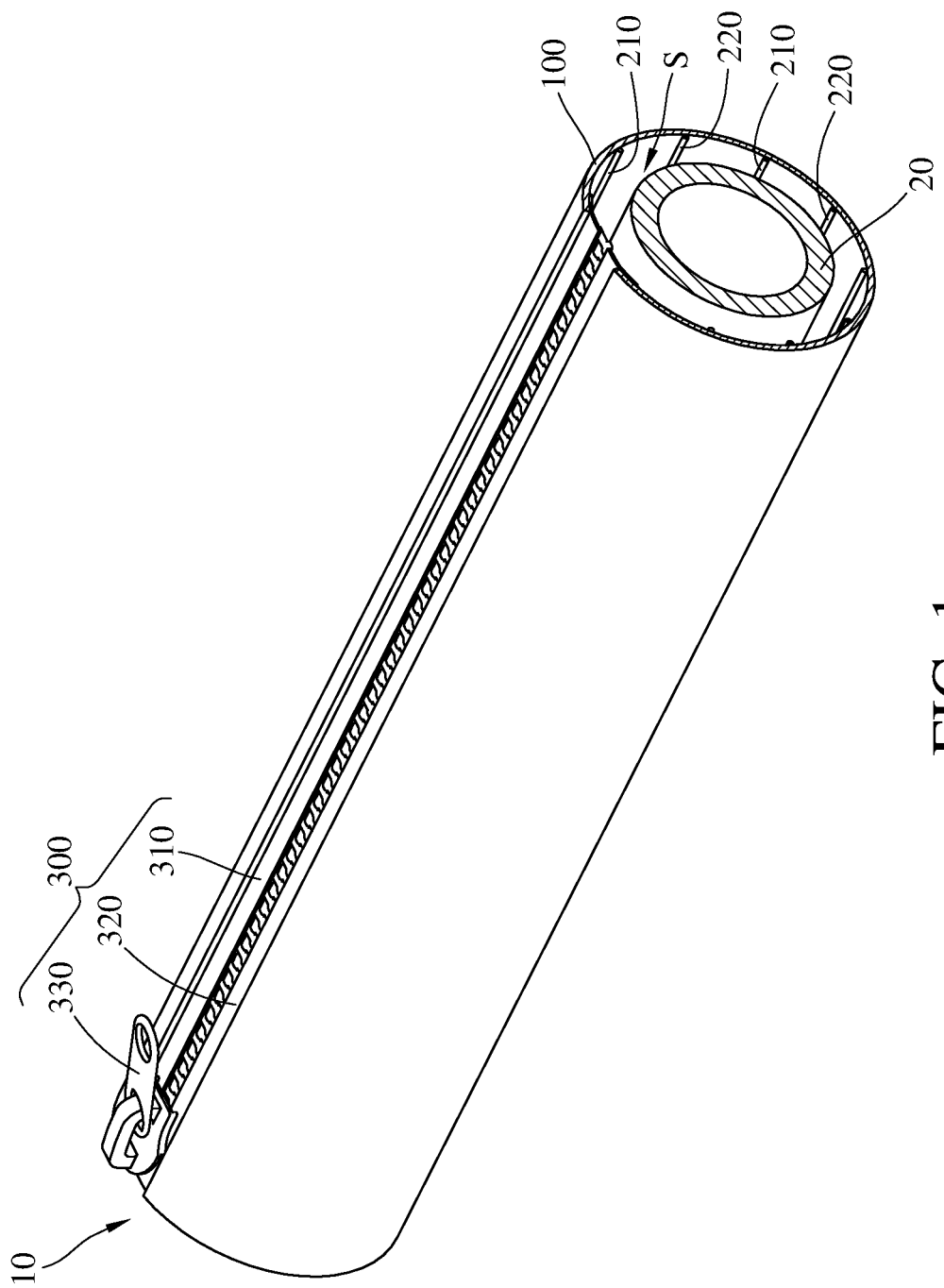
FIG. 1 is a perspective cross-sectional view of an easy-to-mount leakage detection sleeve according to a first embodiment of the disclosure.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

Figure 2:
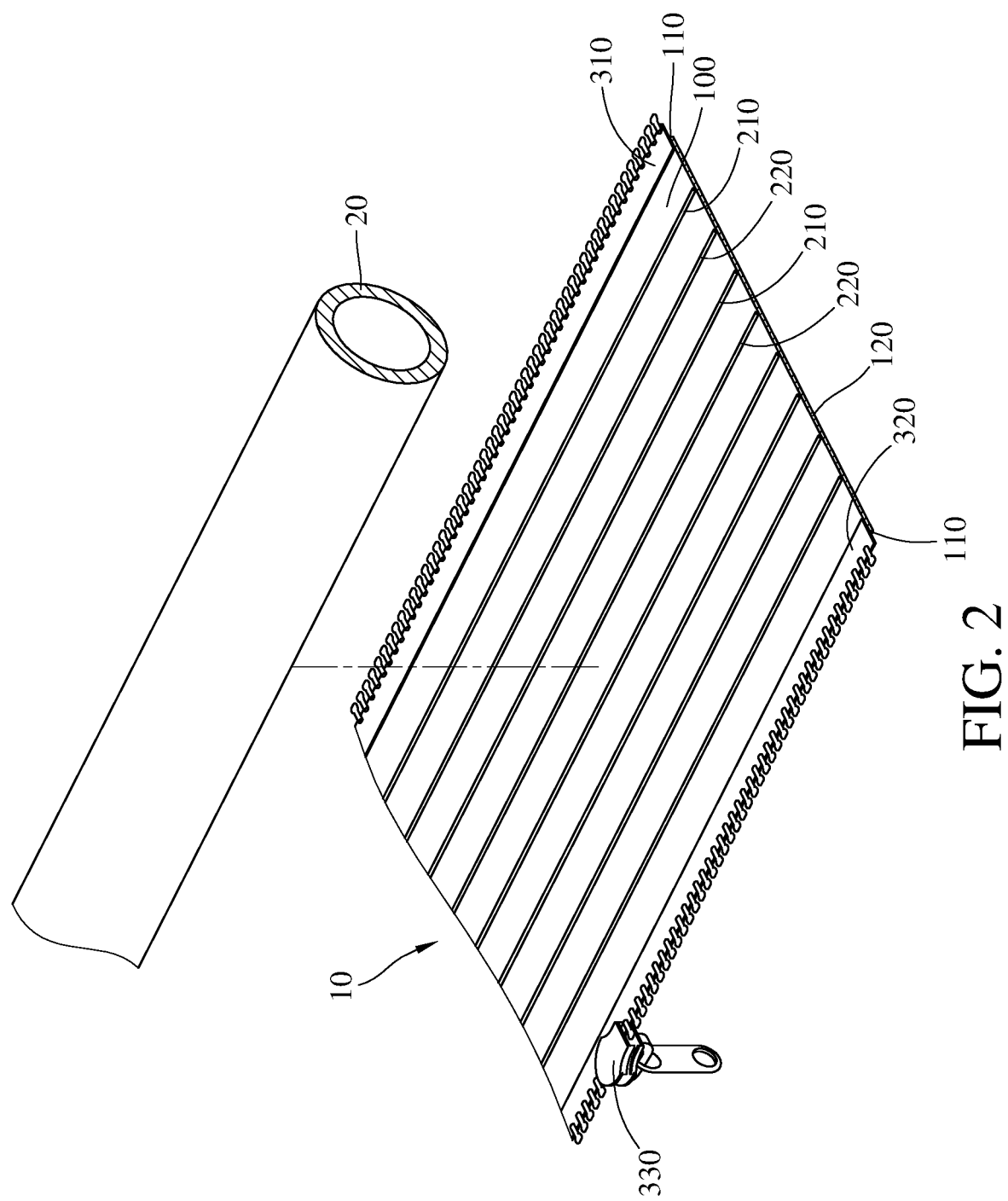
FIG. 2 is an exploded view of FIG. 1.
Figure 3:
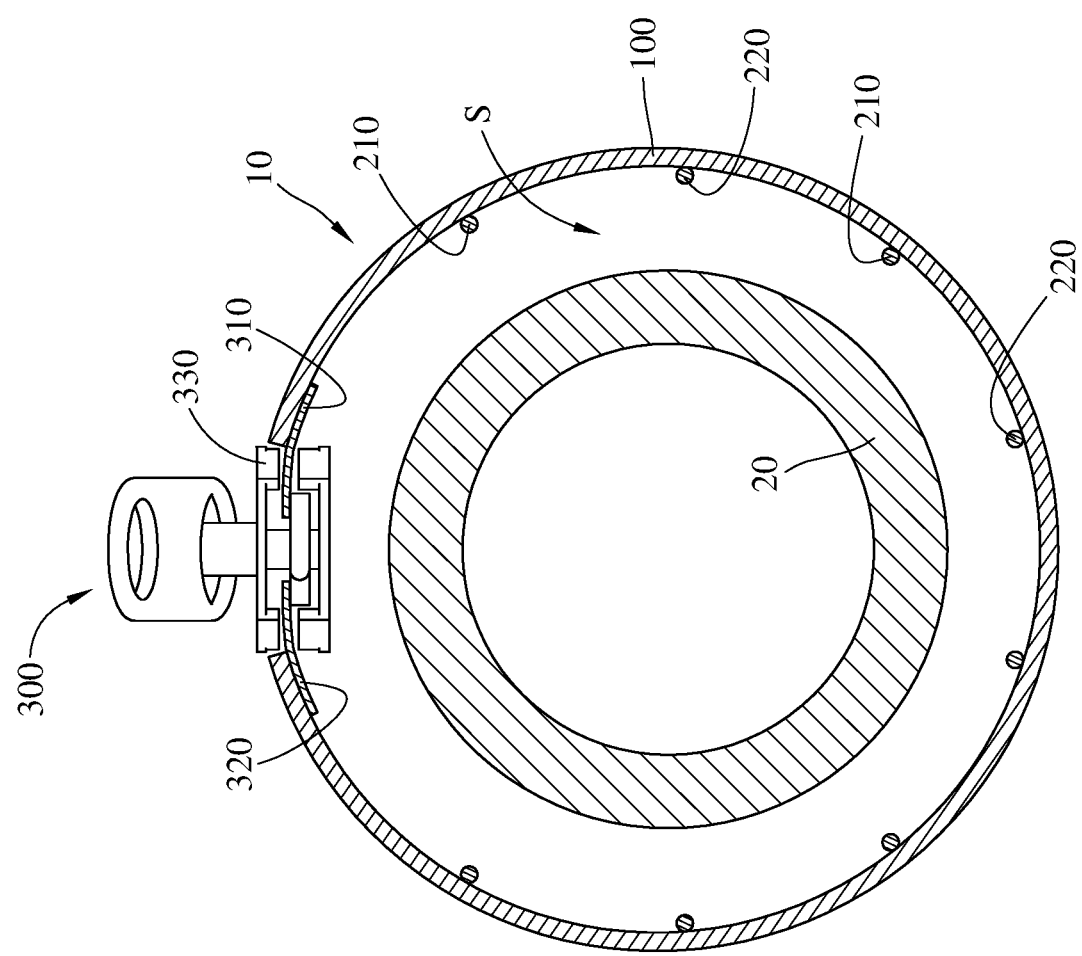
FIG. 3 is a cross-sectional view of FIG. 1.

Please refer to FIG. 1 to FIG. 3. FIG. 1 is a perspective cross-sectional view of an easy-to-mount leakage detection sleeve according to a first embodiment of the disclosure. FIG. 2 is an exploded view of FIG. 1. FIG. 3 is a cross-sectional view of FIG. 1.

This embodiment provides an easy-to-mount leakage detection sleeve 10 configured to be sleeved on a tube 20. The easy-to-mount leakage detection sleeve 10 may also be simply called 'leakage detection sleeve' 10 hereinafter. In this embodiment, the leakage detection sleeve 10 includes a flexible water absorbing layer 100, a plurality of electrically conductive wires 210 and 220 and a connecting assembly 300. The flexible water absorbing layer 100 may be made of fibers capable of absorbing water or other electrically conductive liquid. The flexible water absorbing layer 100 has two opposite first edges 110 and two opposite second edges 120. In this embodiment, the first edge 110 is longer than the second edge 120, but the disclosure is not limited thereto.

In addition, the flexible water absorbing layer 100 is insulated before absorbing water. However, after the flexible water absorbing layer 100 absorbs water, the part of the flexible water absorbing layer 100 that contains water will be electrically conductive, and the rest part that is free from water remains dry and insulated.

The electrically conductive wires 210 and 220 are disposed on the flexible water absorbing layer 100 and are spaced apart from one another. Specifically, as shown in FIG. 2, the electrically conductive wires 210 and 220 are alternately arranged. In addition, the electrically conductive wires 210 and 220 are configured to be coupled to opposite electrodes. In detail, if the electrically conductive wires 210 are coupled to one of the anode and the cathode of a leakage detector (not shown), the electrically conductive wires 220 will be coupled to another one of the anode and the cathode of the leakage detector.

When leakage occurs in the tube 20, the flexible water absorbing layer 100 will absorb the leakage and partially or entirely become electrically conductive. At this moment, as the electrically conductive part of the flexible water absorbing layer 100 contacts any one of the electrically conductive wires 210 and any one of the electrically conductive wires 220, the flexible water absorbing layer 100 will make them electrically connected and then cause the leakage detector to generate an alarm to warn personnel.

The connecting assembly 300 includes a first connecting part 310, a second connecting part 320 and a slider head 330. The first connecting part 310 and the second connecting part 320 are respectively disposed on the first edges 110 of the flexible water absorbing layer 100. The first connecting part 310 and the second connecting part 320 may be the zipper tapes with teeth. The slider head 330 is disposed on and slidable along the first connecting part 310 and the second connecting part 320 so as to engage the first connecting part 310 and the second connecting part 320 to each other or disengage the first connecting part 310 and the second connecting part 320 from each other. As the first connecting part 310 and the second connecting part 320 are engaged together, the flexible water absorbing layer 100 forms a tube accommodation space S that is configured to accommodate the tube 20.

Note that the disclosure is not limited by the configuration of the connecting assembly 300 and how the flexible water absorbing layer 100 forms the tube accommodation space S. For example, in other embodiments, the connecting assembly may not have the slider head 330, and the first connecting part and the second connecting part may be a Velcro (i.e., the hook-and-loop fasteners) or any other male and female pieces that can be engaged to each other.

In addition, in this embodiment, as the tube 20 is wrapped or surrounded by the flexible water absorbing layer 100, the electrically conductive wires 210 and 220 are disposed on the inner side of the flexible water absorbing layer 100; that is, all of the electrically conductive wires 210 and 220 are located in the tube accommodation space S. Moreover, the electrically conductive wires 210 and 220 will be located on different sides of the tube 20 when the flexible water absorbing layer 100 is mounted on the tube 20.

Further, in other embodiments, the electrically conductive wires 210 and 220 may be sewn on the flexible water absorbing layer 100. In this case, the electrically conductive wires 210 and 220 each may be partially located inside the flexible water absorbing layer 100 and partially located outside the flexible water absorbing layer 100 with respect to the tube accommodation space S.

Figure 4:
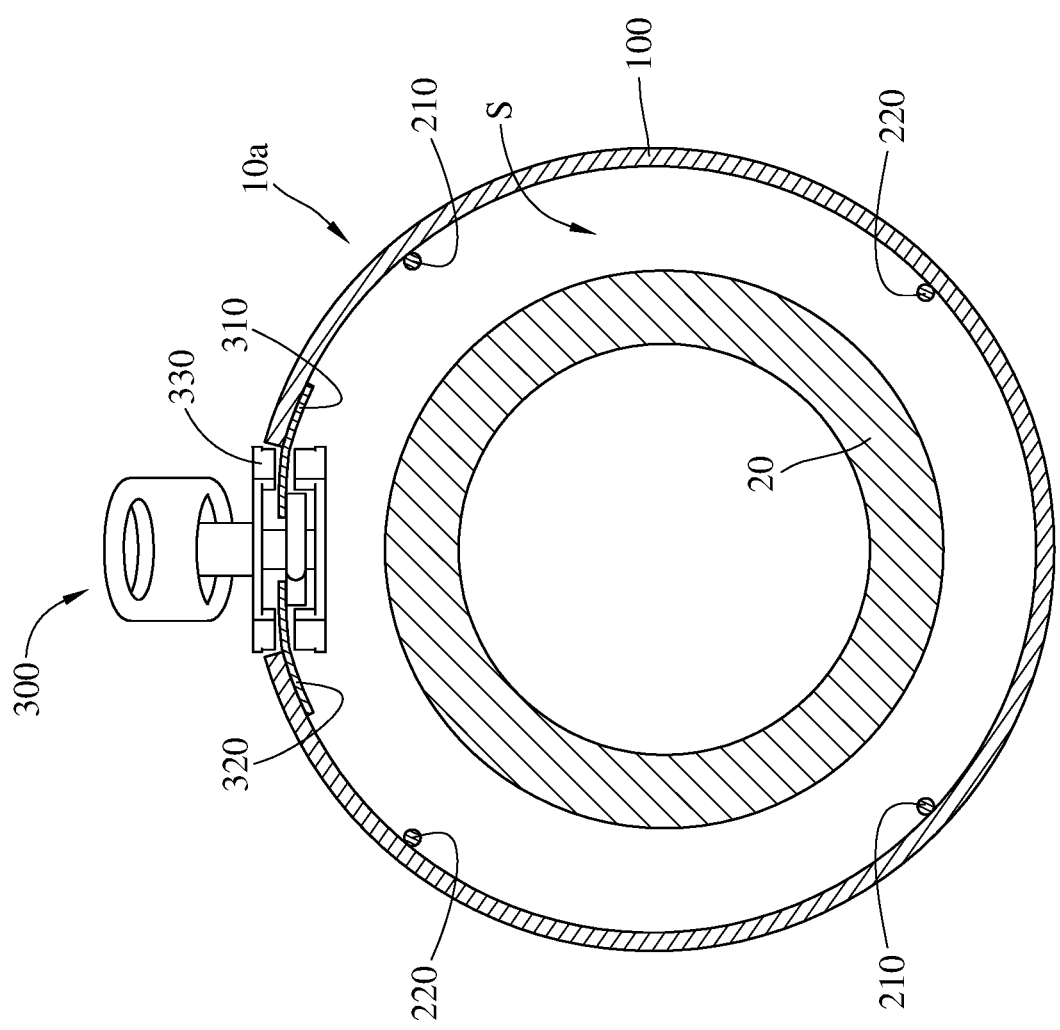
FIG. 4 is a cross-sectional view of an easy-to-mount leakage detection sleeve according to a second embodiment of the disclosure.

In addition, in the embodiment, the quantity of the electrically conductive wires 210 and 220 is eight, but the disclosure is not limited thereto. Please refer to FIG. 4 showing a cross-sectional view of an easy-to-mount leakage detection sleeve according to a second embodiment of the disclosure. This embodiment provides a leakage detection sleeve 10a, and the leakage detection sleeve 10a only have two electrically conductive wires 210 and two electrically conductive wires 220. Similarly, the electrically conductive wires 210 and 220 will be located on different sides of the tube 20 when the flexible water absorbing layer 100 is mounted on the tube 20.

Figure 5:
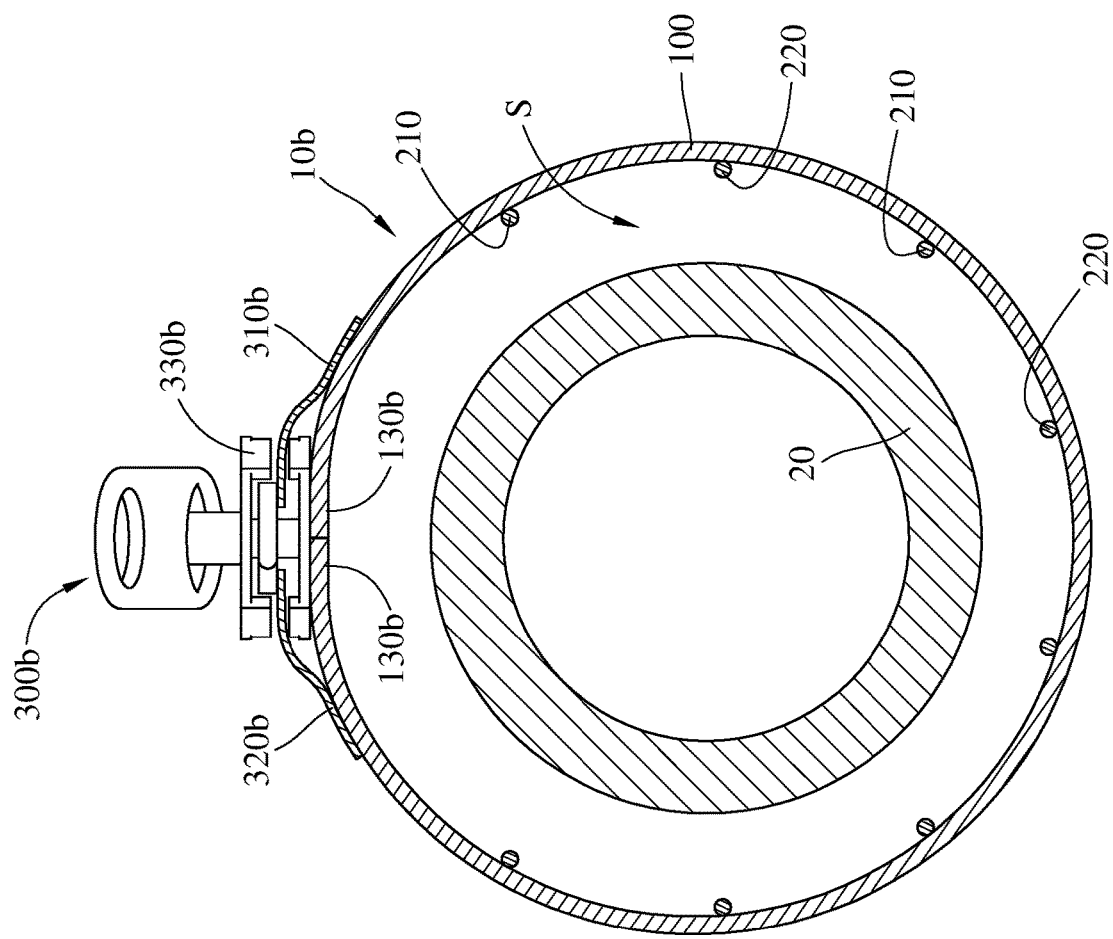
FIG. 5 is a cross-sectional view of an easy-to-mount leakage detection sleeve according to a third embodiment of the disclosure.

Then, please refer to FIG. 5 showing a cross-sectional view of an easy-to-mount leakage detection sleeve according to a third embodiment of the disclosure. This embodiment provides a leakage detection sleeve 10b. The leakage detection sleeve 10b includes a connecting assembly 300b, and the connecting assembly 300b includes a first connecting part 310b, a second connecting part 320b and a slider head 330b. As the tube 20 is wrapped or surrounded by the flexible water absorbing layer 100, the first connecting part 310b, the second connecting part 320b and the slider head 330b of the connecting assembly 300b are all located on the outer side of the flexible water absorbing layer 100 with respect to the tube accommodation space S. In such a case, the two opposite sides of the flexible water absorbing layer 100 are allowed to be extended toward and in contact with each other, thereby eliminating the gap between the two opposite sides of the flexible water absorbing layer 100. As shown in FIG. 5, there are two extension parts 130b respectively located at the two opposite sides of the flexible water absorbing layer 100, and the extension parts 130b are able to contact each other to eliminate the gap as the first connecting part 310b and the second connecting part 320b are engaged with each other. In addition, the extension parts 130b may be different in length in other embodiments, and the disclosure is not limited thereto.

Figure 6:
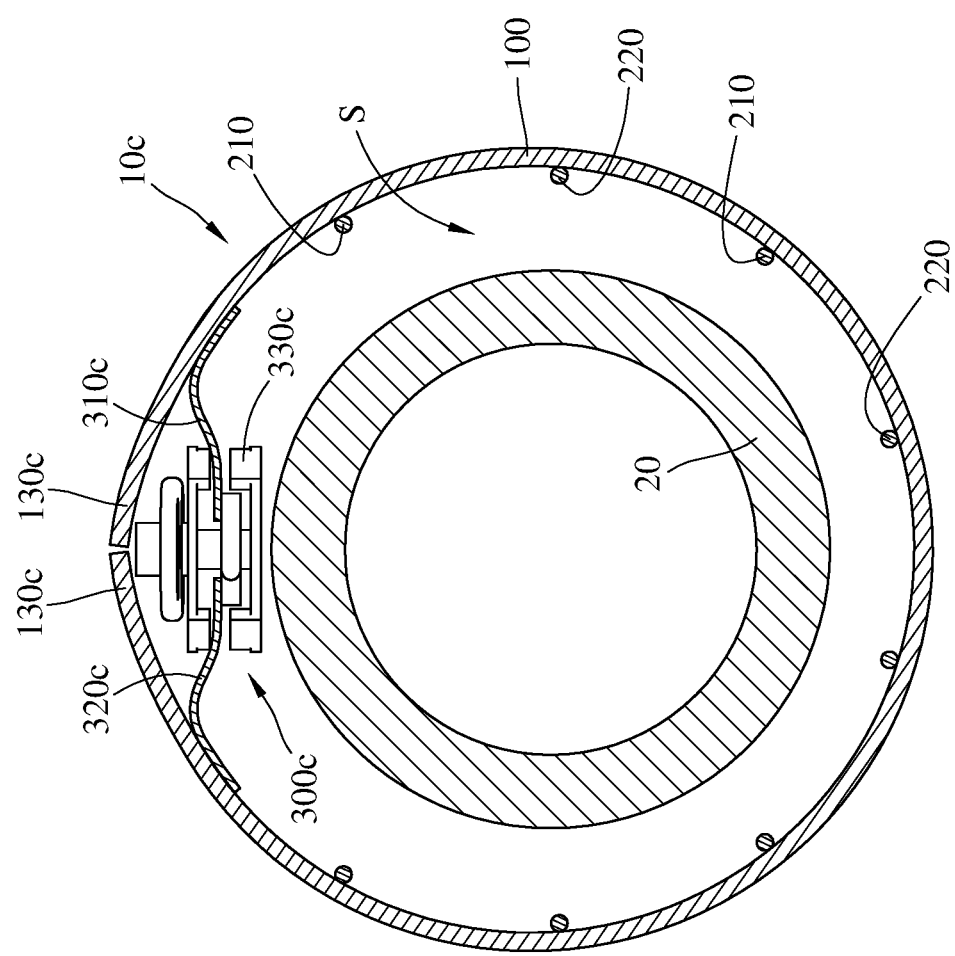
FIG. 6 is a cross-sectional view of an easy-to-mount leakage detection sleeve according to a fourth embodiment of the disclosure.

Then, please refer to FIG. 6 showing a cross-sectional view of an easy-to-mount leakage detection sleeve according to a fourth embodiment of the disclosure. This embodiment provides a leakage detection sleeve 10c. The leakage detection sleeve 10c includes a connecting assembly 300c, and the connecting assembly 300c includes a first connecting part 310c, a second connecting part 320c and a slider head 330c. As the tube 20 is wrapped or surrounded by the flexible water absorbing layer 100, the flexible water absorbing layer 100 covers at least part of the connecting assembly 300c. In detail, the flexible water absorbing layer 100 has two extension parts 130c configured for covering the connecting assembly 300c and eliminating the gap of the flexible water absorbing layer 100, such that the first connecting part 310c, the second connecting part 320c and the slider head 330c of the connecting assembly 300c are all located in the tube accommodation space S as the first connecting part 310c and the second connecting part 320c are engaged with each other. In addition, the extension parts 130b may be different in length in other embodiments, and the disclosure is not limited thereto.

According to the leakage detection sleeve discussed above, due to the first connecting part and the second connecting part, the flexible water absorbing layer with the electrically conductive wires can form the tube accommodation space and be easily mounted on or removed from the tube. Therefore, the leakage detection sleeve can be directly mounted on the tube and timely detect the leakage in the tube.

It will be apparent to those skilled in the art that various modifications and variations can be made to the present disclosure. It is intended that the specification and examples be considered as exemplary embodiments only, with a scope of the disclosure being indicated by the following claims and their equivalents.

What is claimed is:
1. An easy-to-mount leakage detection sleeve, configured to be mounted on a tube, the easy-to-mount leakage detection sleeve comprising:
a flexible water absorbing layer;

a plurality of electrically conductive wires disposed on the flexible water absorbing layer and spaced apart from each other; and a connecting assembly, comprising a first connecting part and a second connecting part, the first connecting part and the second connecting part respectively disposed on two opposite sides of the flexible water absorbing layer, and the second connecting part detachably engaged with the first connecting part so that the flexible water absorbing layer forms a tube accommodation space configured for accommodating the tube.

2. The easy-to-mount leakage detection sleeve according to claim 1, wherein the first connecting part and the second connecting part are zipper tapes with teeth that are detachably engaged with each other, the connecting assembly further comprises a slider head disposed on and slidable along the first connecting part and the second connecting part so as to engage the first connecting part and the second connecting part with each other or disengage the first connecting part and the second connecting part from each other.

3. The easy-to-mount leakage detection sleeve according to claim 1, wherein the flexible water absorbing layer has two opposite first edges and two opposite second edges, each of the first edges is longer than each of the second edges, and the first connecting part and the second connecting part are respectively disposed on the first edges of the flexible water absorbing layer.

4. The easy-to-mount leakage detection sleeve according to claim 1, wherein a quantity of the plurality of the electrically conductive wires is four, and when the flexible water absorbing layer is mounted on the tube, the electrically conductive wires are respectively located on different sides of the tube.

5. The easy-to-mount leakage detection sleeve according to claim 1, wherein a quantity of the plurality of the electrically conductive wires is eight, and when the flexible water absorbing layer is mounted on the tube, the electrically conductive wires are respectively located on different sides of the tube.

6. The easy-to-mount leakage detection sleeve according to claim 1, wherein the plurality of the electrically conductive wires are sewn on the flexible water absorbing layer.

7. The easy-to-mount leakage detection sleeve according to claim 1, wherein each of the plurality of the electrically conductive wires is at least partially located in the tube accommodation space.

8. The easy-to-mount leakage detection sleeve according to claim 1, wherein the plurality of the electrically conductive wires are configured to be connected to different electrodes.

9. The easy-to-mount leakage detection sleeve according to claim 8, wherein any two adjacent electrically conductive wires of the plurality of the electrically conductive wires are configured to be connected to different electrodes.

10. The easy-to-mount leakage detection sleeve according to claim 1, wherein when the first connecting part and the second connecting part are engaged with each other, the first connecting part and the second connecting part of the connecting assembly both are not located in the tube accommodation space, and the two opposite sides of the flexible water absorbing layer are connected to each other.

11. The easy-to-mount leakage detection sleeve according to claim 1, wherein the first connecting part and the second connecting part of the connecting assembly both are partially located in the tube accommodation space of the flexible water absorbing layer when the first connecting part and the second connecting part are engaged with each other.

12. The easy-to-mount leakage detection sleeve according to claim 11, wherein the flexible water absorbing layer covers at least part of the connecting assembly when the first connecting part and the second connecting part are engaged with each other.

* * * * *